(12) United States Patent
Hsu

(10) Patent No.: US 7,971,119 B2
(45) Date of Patent: Jun. 28, 2011

(54) SYSTEM AND METHOD FOR DEFECT-BASED SCAN ANALYSIS

(75) Inventor: Will Hsu, Hsin-Chu (TW)

(73) Assignee: aiwan Semiconductor Manufacturing Company, Ltd., Hsin-Chu (TW)

( * ) Notice: Subject to any disclaimer, the term of this patent is extended or adjusted under 35 U.S.C. 154(b) by 951 days.

(21) Appl. No.: 11/537,043

(22) Filed: Sep. 29, 2006

(65) Prior Publication Data
US 2007/0089001 A1    Apr. 19, 2007

Related U.S. Application Data

(60) Provisional application No. 60/721,647, filed on Sep. 29, 2005.

(51) Int. Cl.
G06F 11/00 (2006.01)
G01R 31/28 (2006.01)
(52) U.S. Cl. .............. 714/741; 714/726; 714/739
(58) Field of Classification Search .......... 714/738, 714/726, 724, 741, 733, 736, 734, 719, 37, 714/742, 732
See application file for complete search history.

(56) References Cited

U.S. PATENT DOCUMENTS

| | | | | |
|---|---|---|---|---|
| 5,291,495 A | * | 3/1994 | Udell, Jr. ............... | 714/726 |
| 5,377,197 A | * | 12/1994 | Patel et al. ............. | 714/724 |
| 5,410,548 A | * | 4/1995 | Millman ................ | 714/741 |
| 5,938,785 A | * | 8/1999 | Dargelas ............... | 714/744 |
| 6,044,214 A | * | 3/2000 | Kimura et al. .......... | 703/15 |
| 6,957,403 B2 | * | 10/2005 | Wang et al. ............ | 716/3 |
| 2004/0064773 A1 | * | 4/2004 | Kundu et al. ........... | 714/741 |
| 2004/0237012 A1 | * | 11/2004 | Prasad et al. .......... | 714/724 |
| 2005/0166114 A1 | * | 7/2005 | Buckley ................ | 714/738 |
| 2006/0005094 A1 | * | 1/2006 | Nozuyama ............. | 714/738 |
| 2006/0053357 A1 | * | 3/2006 | Rajski et al. ........... | 714/742 |
| 2006/0259842 A1 | * | 11/2006 | Marinissen et al. ..... | 714/738 |

OTHER PUBLICATIONS

Aitken, "Finding Defects with Fault Models", International Test Conference (26th: 1995: Washington, D.C.), pp. 498-505.*

(Continued)

Primary Examiner — Jeffrey A Gaffin
Assistant Examiner — Daniel F McMahon
(74) Attorney, Agent, or Firm — Haynes and Boone, LLP

(57) ABSTRACT

A method for defect-based scan analysis comprises, determining a neighborhood net for a circuit node, injecting defects into the neighborhood net, modeling the defects with stuck-at-0 and stuck-at-1 fault models, generating and applying test patterns to the neighborhood net, determining whether the injected defects are observable as faults, adding the test patterns to a set of effective test patterns if the defects are observable, mapping the test patterns to possible stuck-at-0 faults or stuck-at-1 faults, collecting stuck-at-0 and stuck-at-1 fault test patterns, performing stuck-at-0 and stuck-at-1 fault simulations using the stuck-at-0 and stuck-at-1 fault test patterns, respectively, generating first and second fault lists, combining first and second fault lists into combined fault lists, deriving a description of the combined fault lists using a complete set of fault models, filtering the combined fault lists to yield a collection of effective faults, and determining a defect for each of the effective faults.

30 Claims, 8 Drawing Sheets

OTHER PUBLICATIONS

Zijiang Lin, et al., "High-Frequency, At-Speed Scan Testing," Co-published by the IEEE CS and the IEEE CASS, Sep.-Oct. 2003, pp. 17-25.

Vamsi Boppana, et al., "Modeling the Unknown! Towards Model-Independent Fault and Error Diagnosis," International Test Conference (29th: 1998: Washington, D.C.), pp. 1094-1101.

Robert C. Aitken, "Finding Defects with Fault Models," International Test Conference (26th: 1995: Washington, D.C.), pp. 498-505.

Patrick Girard, et al., "High Defect Coverage with Low Power Test Sequences in a BIST Environment," IEEE Design & Test Special Issue on Defect Oriented Testing in Deep Submicron Era, Sep./Oct. 2002 (vol. 19, No. 5) pp. 44-52.

Rene David, "Random Adjacent Sequences: An Efficient Solution for Logic BIST," IFIP Conference Proceedings; vol. 218, Publisher: Kluwer, B.V. Deventer, The Netherlands, pp. 1-12.

* cited by examiner

| A | | A' | | DecCode | Fault Model | P(F=0)/P(SA0) | P(F=1)/P(SA1) |
|---|---|---|---|---|---|---|---|
| 0 | 0 | 0 | 0 | 0 | SA0 | 0 | 1 |
| 0 | 0 | 0 | 1 | 1 | Wired OR | 0 | % |
| 0 | 0 | 1 | 0 | 2 | Wired OR | 0 | % |
| 0 | 0 | 1 | 1 | 3 | ESCAPE | 0 | 0 |
| 0 | 1 | 0 | 0 | 4 | Inverted Wired AND | % | 1 |
| 0 | 1 | 0 | 1 | 5 | Dominant | % | % |
| 0 | 1 | 1 | 0 | 6 | Dominant | % | % |
| 0 | 1 | 1 | 1 | 7 | Wired AND | % | 0 |
| 1 | 0 | 0 | 0 | 8 | Inverted Wired AND | % | 1 |
| 1 | 0 | 0 | 1 | 9 | Dominant | % | % |
| 1 | 0 | 1 | 0 | 10 | Dominant | % | % |
| 1 | 0 | 1 | 1 | 11 | Wired AND | % | 0 |
| 1 | 1 | 0 | 0 | 12 | Inverted | 1 | 1 |
| 1 | 1 | 0 | 1 | 13 | Inverted Wired OR | 1 | % |
| 1 | 1 | 1 | 0 | 14 | Inverted Wired OR | 1 | % |
| 1 | 1 | 1 | 1 | 15 | SA 1 | 1 | 0 |

FIG. 4

| Code | Fault Model | P(F=0)/P(SA0) | P(F=1)/P(SA1) | 1 fault report from diagnosis | | multi faults report from diagnosis | |
|---|---|---|---|---|---|---|---|
| | | | | pre-node defect | post-node defect | pre-node defect | post-node defect |
| 1 | SA 1 | 0 | 1 | PMOS (@ output node) | open,bridge | PMOS | open,bridge |
| 2 | SA0 | 1 | 0 | NMOS | open,bridge | NMOS | bridge |
| 3 | Wired AND | % | 0 | PMOS | open | PMOS | bridge |
| 4 | Wired OR | 0 | % | NMOS | open | NMOS | bridge |
| 5 | Dominant | % | % | NODE-NODE bridge | bridge | NODE-NODE bridge | bridge |
| 6 | Inverted | 1 | 1 | NODE-NODE bridge | bridge | NODE-NODE bridge | bridge |
| 7 | Inverted Wired AND | % | 1 | ? | X | ? | bridge |
| 8 | Inverted Wired OR | 1 | % | ? | X | ? | bridge |
| 9 | ESCAPE | 0 | 0 | X | X | X | X |

FIG. 6

| Node A | 1-->0 | 1-->0 | 0-->1 | 0-->1 | | |
|---|---|---|---|---|---|---|
| | F | F | R | R | | |

| | | | | DecCode | Fault Model | P(F=0)/P(SF) | P(F=1)/P(SR) |
|---|---|---|---|---|---|---|---|
| 1-->0 | 1-->0 | 0-->0 | 0-->0 | 0 | SR, Strict Rise | 0 | 1 |
| 1-->0 | 1-->0 | 0-->0 | 0-->1 | 1 | LR, loose Rise | 0 | % |
| 1-->0 | 1-->0 | 0-->1 | 0-->0 | 2 | LR, loose Rise | 0 | % |
| 1-->0 | 1-->0 | 0-->1 | 0-->1 | 3 | ESCAPE | 0 | 0 |
| 1-->0 | 1-->1 | 0-->0 | 0-->0 | 4 | SRLF | % | 1 |
| 1-->0 | 1-->1 | 0-->0 | 0-->1 | 5 | LRLF | % | % |
| 1-->0 | 1-->1 | 0-->1 | 0-->0 | 6 | LRLF | % | % |
| 1-->0 | 1-->1 | 0-->1 | 0-->1 | 7 | LF | % | 0 |
| 1-->1 | 1-->0 | 0-->0 | 0-->0 | 8 | SRLF | % | 1 |
| 1-->1 | 1-->0 | 0-->0 | 0-->1 | 9 | LRLF | % | % |
| 1-->1 | 1-->0 | 0-->1 | 0-->0 | 10 | LRLF | % | % |
| 1-->1 | 1-->0 | 0-->1 | 0-->1 | 11 | LF | % | 0 |
| 1-->1 | 1-->1 | 0-->0 | 0-->0 | 12 | SRSF | 1 | 1 |
| 1-->1 | 1-->1 | 0-->0 | 0-->1 | 13 | LRSF | 1 | % |
| 1-->1 | 1-->1 | 0-->1 | 0-->0 | 14 | LRSF | 1 | % |
| 1-->1 | 1-->1 | 0-->1 | 0-->1 | 15 | SF | 1 | 0 |

% means 0~1

FIG. 8

SYSTEM AND METHOD FOR DEFECT-BASED SCAN ANALYSIS

CROSS-REFERENCE

This application claims priority to U.S. Provisional Patent Application Ser. No. 60/721,647, filed on Sep. 29, 2005.

BACKGROUND

During semiconductor device fabrication, defects may be present due to process abnormalities. In general, defects are the result of material being formed where it should not be or material being absent where it should be. As chip feature sizes shrink further, these defects have become more complex and more difficult to detect during testing.

Traditionally, these defects have been logically represented in scan testing by "faults." The faults can be modeled at various levels of design abstraction. Two known and commonly used fault models are stuck-at-0 (SA0) and stuck-at-1 (SA1) fault models. During testing, a fault is detected when a particular test pattern activates or sensitizes the integrated circuit to the fault and makes the error observable. However, current scan test methodologies use a very limited set of fault models which do not characterize the defect behavior of the integrated circuit completely. Therefore, a large percentage of faults may be undetected by testing and result in unpredictable circuit behavior.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a an embodiment of a truth table of the set of complete static fault models;

FIG. 6 is an embodiment of a truth table of defects derived from the set of complete fault models;

FIG. 8 is a an embodiment of a truth table of the set of complete transition delay fault models.

DETAILED DESCRIPTION

Figure 1:
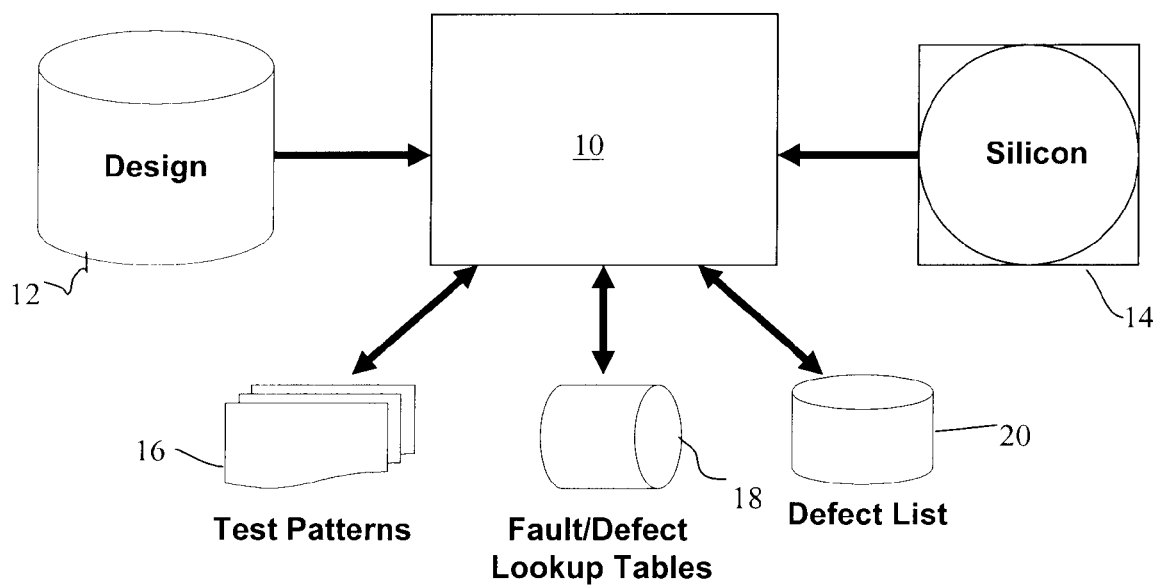
FIG. 1 is a simplified block diagram of an embodiment of a system and method for defect-based scan analysis.

FIG. 1 is a simplified block diagram of an embodiment of a system and method 10 for defect-based scan analysis. System 10 is operable to receive one or more computer-readable files that describe the design of an integrated circuit 12 in a format now known or to be developed. The integrated circuit design files 12 may include logic design, physical layout, and other design representations. Using design files 12 and/or a production chip 14 with injected defects as input data, system 10 is operable to generate one or more sets of test patterns 16 that are effective in uncovering the defects that are observable as faults. Using the generated test patterns 16 and a fault/defect lookup table 18, a defect list 20 of the integrated circuit design can then be diagnosed and provided as output. In this process, only stuck-at-0 (SA0) and stuck-at-1 (SA1) fault models are used to derive a complete set of fault models for a more comprehensive characterization of defect behavior in the integrated circuit. System 10 may be any suitable computing device including workstations, personal computers, laptop computers, notebook computers, etc. Suitable user interface screen and devices may be employed to receive user input and selections.

Figure 2:
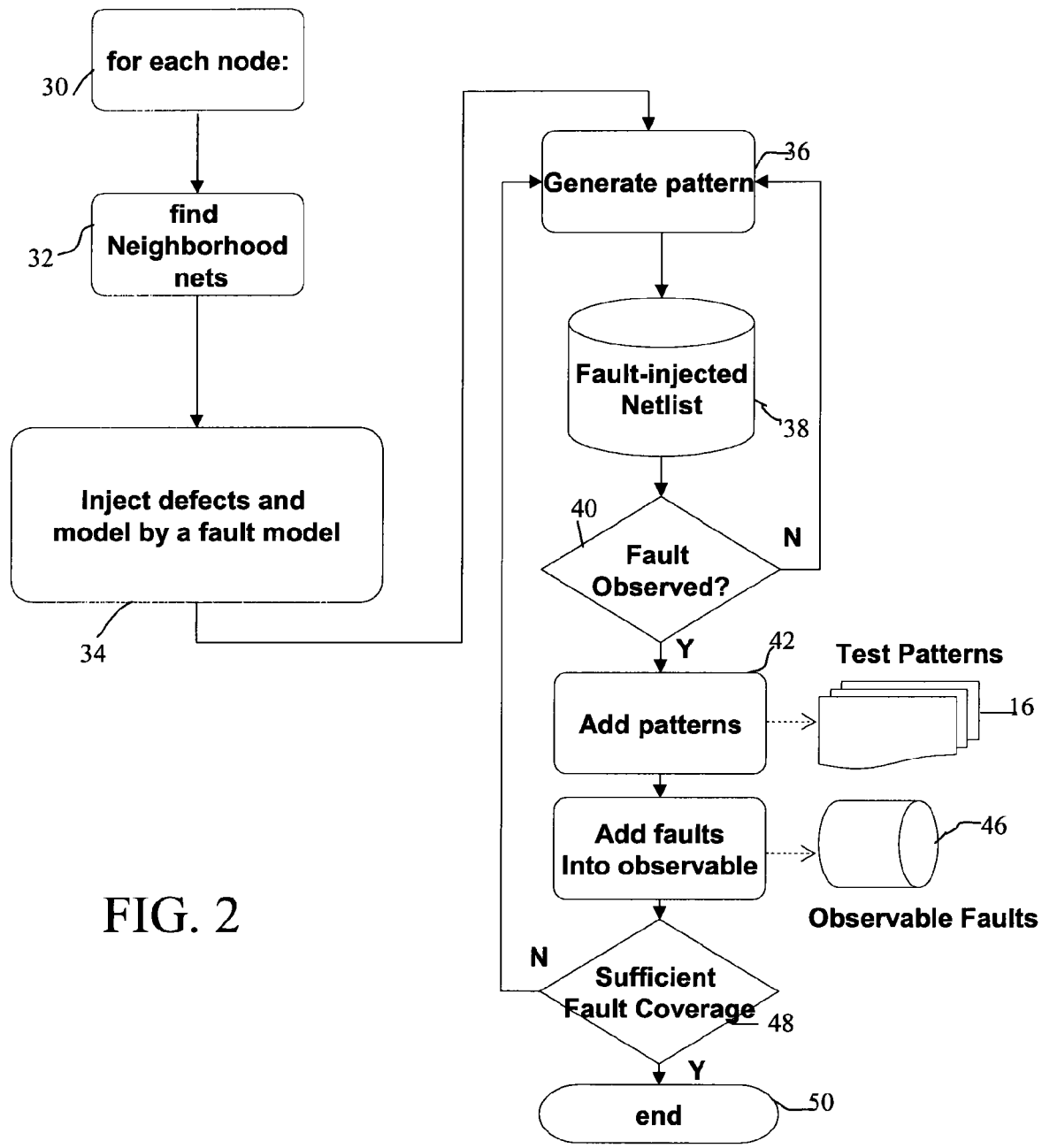
FIG. 2 is a simplified flowchart of an embodiment of a method of generating test patterns.

FIG. 2 is a simplified flowchart of an embodiment of a method of generating test patterns. In step 30, a particular node of a circuit design is isolated for analysis. In one embodiment of the method shown in FIG. 2, the circuit is analyzed on a transistor layout level rather than at the logic gate level. Other embodiments of the method enable the analysis to be performed at various other design abstraction levels and the method described herein should not be limited to the transistor layout abstraction level.

In step 32, the neighborhood nets of the isolated node is identified for analysis since the behavior at the isolated node is most likely to be affected by neighboring circuits. In step 34, one or more known defects modeled by a particular fault model are injected into the circuit neighborhood nets. For example, defects may be injected into the circuit that would be observable as a stuck-at-1 fault. In steps 36 and 38, one or more test patterns are generated and applied to the net list having the injected fault. In step 40, a determination is made as to whether the injected fault is observable. A fault is observable if the test pattern applied to the net list sensitizes or activates the circuit to the fault and propagates the resulting error to an observable point. If the fault cannot be observed, then execution returns to step 36 to generate more test patterns. Else if the fault can be observed, then in step 42 the test pattern is added to a collection of effective test patterns 16. Further, the observed fault is added to a collection of observable faults 46. A determination is then made in step 48 as to whether sufficient fault coverage has been made. The determination in step 48 may be made with respect to an process time limit, a percentage of faults uncovered, a number of faults uncovered, and/or a number of other factors. If an insufficient fault coverage has so far been made, more test patterns are generated in step 36. Else, the process ends in step 50.

Figure 3:
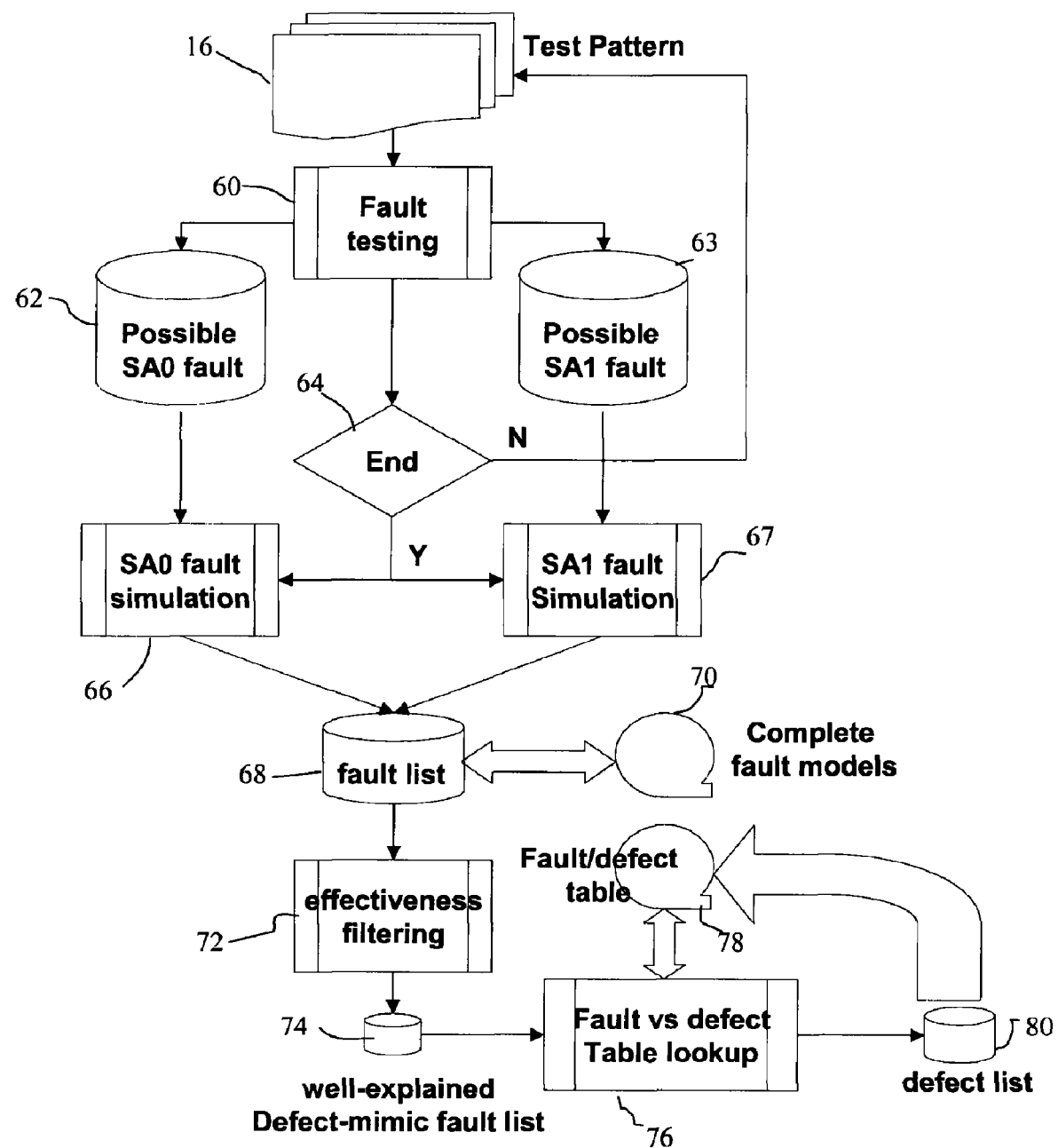
FIG. 3 is a simplified flowchart of an embodiment of a method of defect-based scan analysis.

FIG. 3 is a simplified flowchart of an embodiment of a method of defect-based scan analysis. A collection of effective test patterns 16 which may have been derived by a process described above and shown in FIG. 2, is provided as input to this process. In step 60, a determination is made as to which fault yields the observed failure, and the test patterns are sorted into database 62 for possible stuck-at-0 fault or in database 63 for possible stuck-at-1 fault, respectively. The collection of test patterns are thus sorted in this manner until all have been analyzed, as determined in step 64. Thereafter, SA0 fault simulations are performed on a per-node basis in step 66, where SA0 faults are injected into the net list and each test pattern in database 62 is simulated to obtain failure patterns generated by the SA0 faults. SA1 fault simulation on a per-node basis is similarly performed in step 67, where SA1 faults are injected into the net list and each test pattern in database 63 is simulated to obtain failure patterns generated by the SA1 faults. The simulation results are collected in a fault list database 68. The fault list in database 68 is on a per node basis.

The SA0 and SA1 fault list uses a complete set of fault models 70 that are derived as a combination of the SA0 and SA1 faults. The derivation of the complete set of nine fault models is shown in a truth table in FIG. 4. The interaction of node A with another net, such as power, ground, or another signal, under a number of fault conditions is considered. All possible logic level combinations for the isolated node, A, and a node after this interaction, A', due to various faults are mapped to the respective fault models 70. Failure from any fault model is a subset of a union of SA0 and SA1 failure. For a specific node N, C is the control state, F is the fault model state, and D is the defect state, and the complete set of nine fault models may be derived from the stuck-at fault models as shown below:

{patterns}
= {C}
= {C = 0} ∪ {C = 1}
= {C = 0, F = 0} ∪ {C = 0, F = 1} ∪ {C = 1, F = 0} ∪ {C = 1, F = 1}
for SA0 failure F ≡ 0,
= {SimFAIL|C = 1, F = 0} ∪ {PASS|C = 1, F = 0} ∪ {PASS|C = 0}
for SA1 failure F ≡ 1,
= {SimFAIL|C = 0, F = 1} ∪ PASS|C = 0, F = 1} ∪ {PASS|C = 1}
{SimFAIL|C = 0, F = 1}
= {SimFAIL|C = 0, F = 1, D = 1} ∪ {SimFAIL|C = 0, F = 1, D = 0}
{SimFAIL|C = 1, F = 0}
= {SimFAIL|C = 1, F = 0, D = 0} ∪ {SimFAIL|C = 1, F = 0, D = 1}
for defect D showing certain fault model, we could observe
{TestFAIL|C = 0, D = 1} ∪ {TestFAIL|C = 1, D = 0}
= {SimFAIL|C = 0, F = 1, D = 1} ∪ {SimFAIL|C = 1, F = 0, D = 0}

After equivalent cases are combined, the stuck-at fault models are used to derive nine fault models: SA0, SA1, wired OR (WOR), wired AND (WAND), inverted WOR, inverted WAND, dominant, inverted, and escape. The dominant fault model represents the defect where the logic level of one signal dominates the node, A, and the logic level of A' is always the logic level of the dominant signal. The escape fault model represents the defect where the effects escapes observation.

Figure 5:
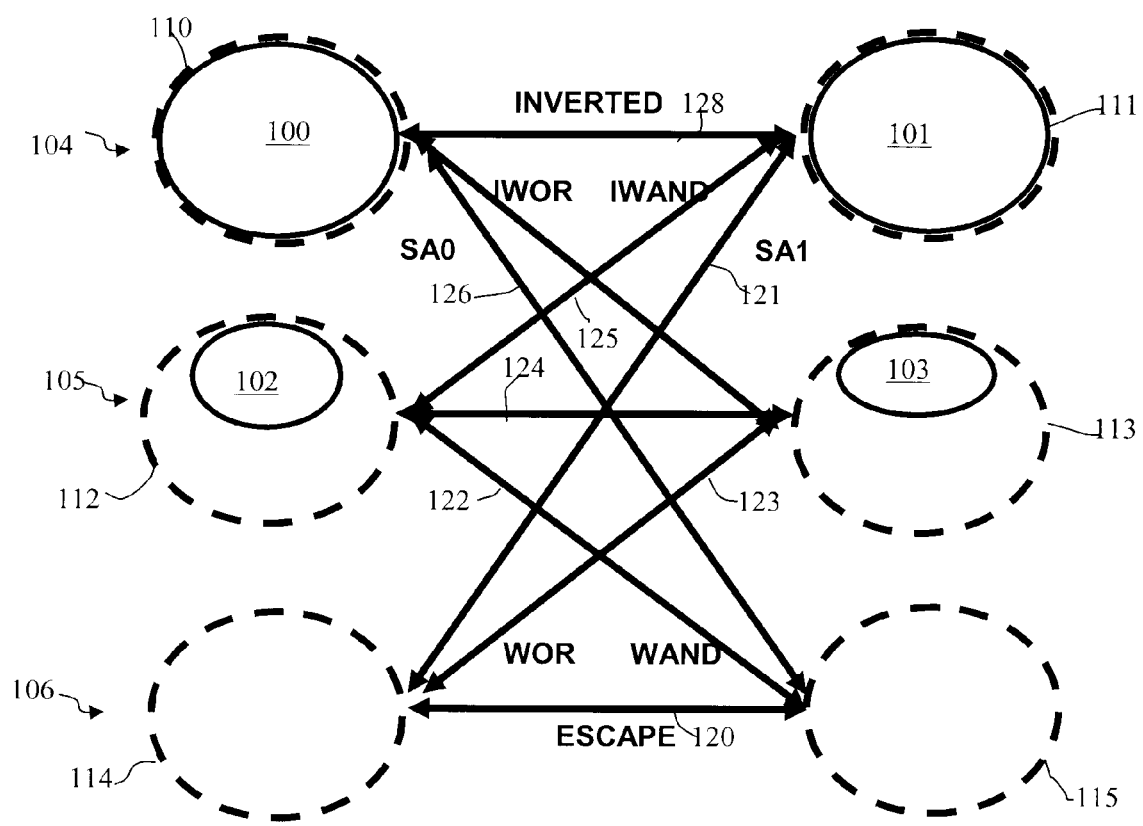
FIG. 5 is a diagram illustrating the derivation of the set of complete fault models.

In step 72, a filtering process is performed so that the more effective fault lists are kept and the less effective fault models are screened out. An effective fault model is one that provides optimal coverage or optimal representation of the defects. Referring to FIG. 5 for a diagram illustrating the derivation of the set of complete fault models, the solid ellipses 100-103 represent the observed defects in silicon. The dashed ellipses 110-115 represent the coverage of SA0 and SA1 fault models (dashed ellipses 110, 112, and 114 are SA0 coverage; dashed ellipses 111, 113, and 115 are SA1 coverage). The dashed ellipses 110 and 111 indicate that the fault models provide a perfect coverage or match of the defects; the dashed ellipses 112 and 113 indicate that the fault models provide a partial mismatch of the defects; and the dashed ellipses 114 and 115 indicate that the fault models provide no coverage of the defects. Following FIG. 5, all possible pairing of the SA0 and SA1 faults results in the truth table shown below:

TABLE A

| SA0 | SA1 | Fault Model |
|-----|-----|-------------|
| 0   | 0   | ESCAPE 120  |
| 0   | 1   | SA1 121     |
| 0   | %   | WAND 122    |
| %   | 0   | WOR 123     |
| %   | %   | DOMINANT 124 |
| %   | 1   | IWAND 125   |
| 1   | 0   | SA0 126     |
| 1   | %   | IWOR 127    |
| 1   | 1   | INVERTED 128 |

In the table above, "0" no coverage by the SA0 or SA1 fault models, "1" indicates good coverage by the SA0 or SA1 fault models, and "%" indicates a partial coverage or partial detection by the SA0 or SA1 fault models.

The SA-0 and SA1 simulation results for each node may be expressed as [(T0/S0), (T1/S1)], where T0 is the tester fail pattern count when the defect activates the node to 0 or a logic low; S0 is the simulation fail pattern when the SA0 fault is inserted at the node; T1 is the tester fail pattern count when the defect activates the node to 1 or a logic high; S1 is the simulation fail pattern when the SA1 fault is inserted at the node. These numbers are indicative of the best fault model that would best predict the defect. For example, a simulation result may yield:

TABLE B

| T0 | S0 | T0/S0 | T1 | S1 | T1/S1 | Fault Model |
|----|----|----|----|----|----|----|
| 8  | 42 | ~1/5 | na | na | na | WOR |
| na | na | na | 1 | 12 | 1/12 | WAND |
| na | na | na | 1 | 6 | 1/6 | WAND |
| 14 | 29 | ~1/2 | 11 | 21 | ~1/2 | DOMINANT |

It may be seen that the dominant fault model yields the best coverage because 50% coverage is better tan the coverage from the other fault models. Therefore, the dominant fault model is the diagnosed result. Therefore in FIG. 3, step 72, the less effective fault models are removed or filtered from the fault list to result in a smaller fault list 74 that includes fault models that provide the best coverage. The list of effective faults 74 are then used in step 76 to reference a fault vs. defect lookup table 78. FIG. 6 is an embodiment of a truth table of defects derived from the set of complete fault models, and FIG. 7 is another representation of an embodiment of a mapping from fault model to defect.

The truth table in FIG. 6 shows how each fault can be mapped to possible process defects. In the leftmost column, the nine fault models occupy each row. The SA0 and SA1 fault simulation results shown in TABLE A above are arranged in the next two columns. The next two columns are pre-node defect and post-node defects with one fault reported. The last two columns are pre-node defect and post-node defects with more than one fault reported. The term "pre-node" defect indicates that the defect occurred in the process or design layer below the metal-1 layer. Post-node defect indicates that the defect occurred in the interconnections, i.e., in the metal-1 layer and above. The PMOS entries in the table indicate that the defect may be in the p-type MOS (metal oxide semiconductor) structures in the neighborhood net; the NMOS entries in the table indicate that the defect may be in the n-type MOS structures in the neighborhood net; the "open" entries indicate that the defect may be an open circuit in the neighborhood net; the "bridge" entries indicate that the defect may be a connection between two signals in the neighborhood net where there shouldn't be; the "NODE-NODE bridge" entries indicate that the defect may be a connection between two nodes in the neighborhood net where there shouldn't be; the "X" entries indicate where defect of the type is impossible; and "?" entries indicate that there is some uncertainty as to the possibility of occurrence of this type of defect.

Figure 7:
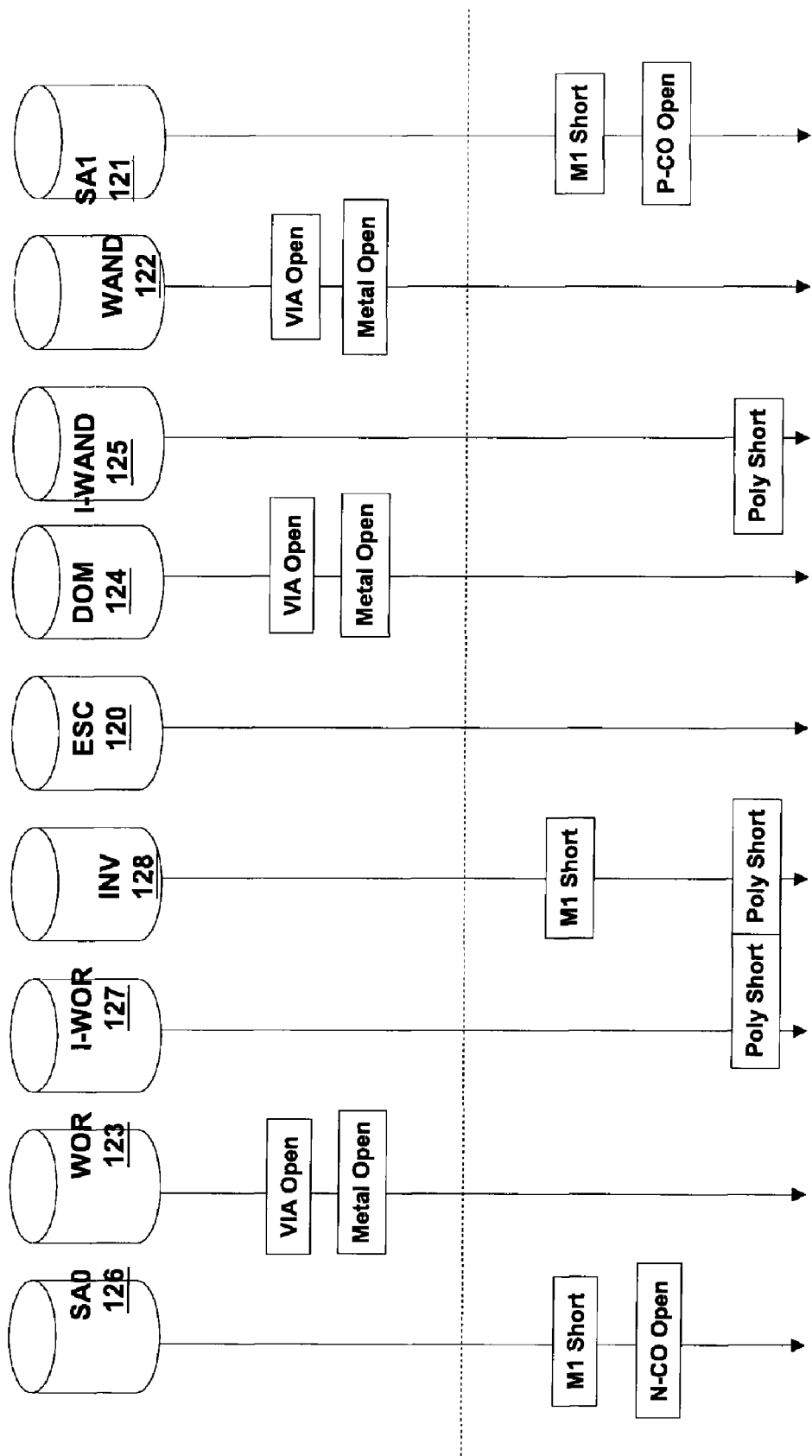
FIG. 7 is an embodiment of a graphical representation of deriving defects from the set of complete fault models.

Referring now to FIG. 7, yet another representation of a mapping from fault models to defects is shown. For SA0 fault 126, the defect may be a short circuit in the metal-1 layer and/or an open circuit in an N-contact. For WOR fault 123, the defect may be a VIA open circuit and/or an open circuit in a metal layer. For IWOR fault 127, the defect may be a short circuit in a polysilicon layer. For inverted fault 128, the defect may be a short circuit in a metal-1 layer and/or a short circuit in a polysilicon layer. For escape fault 120, the defect is undefined. For dominant fault 124, the defect may be a VIA open circuit and/or an open circuit in a metal layer. For IWAND fault 125, the defect may be a short circuit in a polysilicon layer. For WAND fault 122, the defect may be a VIA open circuit and/or an open circuit in a metal layer. For SA1 fault 121, the defect may be a short circuit in the metal-1 layer and/or an open circuit in a P-contact.

FIG. 8 is a an embodiment of a truth table of the set of complete transition delay fault models. Transition delay tests uncover timing-related defects that may be more prevalent in the nanometer geometries of today's integrated circuits. The same methods described above for the complete sent of static fault model derivation and the mapping to defects may be used for transition delay testing. Considering a node A having a timing issue in some manner, test patterns may be generated as in FIG. 2, and complete fault model generation and defect-mapping as in FIG. 3 may be performed. Minor adjustments and/or modifications may be needed to the methods shown in FIGS. 2 and 3 to adapt them to transition delay testing. As shown in FIG. 3, instead of SA0 and SA1, strict rise and strict fall fault mapping and simulation are performed. The results are combined to generate a complete sent of nine faults in the transition delay fault model as shown in FIG. 8. In FIG. 8, the term "strict rise" or "SR" means that the node fails at every low-to-high transition; the term "strict fall" or "SF" means that the node fails at every high-to-low transition; the term "loose rise" or "LR" means that the node does not fail at every low-to-high transition; the term "loose fall" or "LF" means that the node does not fail at every high-to-low transition. Therefore, failure from any fault model is a subset of union of strict rise and strict fall fault. With overlapping conditions combined, the resulting complete set of nine transition delay fault models are: strict rise, strict fall, loose rise, loose fall, strict rise strict fall, loose rise loose fall, strict rise loose fall, loose rise strict fall, and ESCAPE. Using empirical data, the transition delay fault models-to-defects mapping may be done for defect diagnosis.

The method described herein uses simple stuck-at fault models or strict rise and strict fall models to derive a complete set of fault models for the static and transition delay defect diagnosis. Using the processes described herein, test patterns are generated, possible SA0 and SA1 faults (strict rise and strict fall fault models for transition delay analysis) are mapped to a complete set of fault models on a per-node basis, the fault list is filtered so that the most effective faults remain, which are then mapped to possible defects that may have caused the faults.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method for defect-based scan analysis comprising:
   for a node in a first circuit, determining a neighborhood net;
   injecting defects into the neighborhood net and modeling the defects with stuck-at-0 and stuck-at-1 fault models;
   generating test patterns and applying the patterns to the neighborhood net with the injected defects;
   determining whether the injected defects are observable as faults;
   if the defects are observable as faults, adding the test patterns to a set of effective test patterns;
   mapping the test patterns in the set of effective test patterns to possible stuck-at-0 faults or stuck-at-1 faults and collecting stuck-at-0 fault test patterns and stuck-at-1 fault test patterns;
   performing stuck-at-0 fault simulation using the stuck-at-0 fault test patterns and generating a first fault list;
   performing stuck-at-1 fault simulation using the stuck-at-1 fault test patterns and generating a second fault list;
   combining the first and second fault lists into combined fault lists and deriving a description of the combined fault lists using a complete set of fault models;
   filtering the combined fault lists to yield a collection of effective faults, the filtering including removing faults with less effective coverage of the defects than the effective faults; and
   determining a defect for each fault in the collection of effective faults.

2. The method of claim 1, wherein determining a defect comprises referring to a fault vs. defect lookup table.

3. The method of claim 1, wherein deriving a description of the combined fault lists using a complete set of fault models comprises using stuck-at-0, stuck-at-1, wired OR, wired AND, inverted WOR, inverted WAND, dominant, inverted, and escape fault models.

4. The method of claim 3, wherein deriving a description of the combined fault lists using a complete set of fault models comprises considering faults that are completely covered, partially covered and not covered by the stuck-at-0 and stuck-at-1 fault models.

5. The method of claim 4, wherein:
   the escape fault model does not cover stuck-at-0 faults and stuck-at-1 faults;
   the stuck-at-1 fault model does not cover stuck-at-0 faults but covers stuck-at-1 faults;
   the wired AND fault model does not cover stuck-at-0 faults but partially covers stuck-at-1 faults;
   the wired OR fault model partially covers stuck-at-0 faults but does not cover stuck-at-1 faults;
   the dominant fault model partially covers stuck-at-0 faults and partially covers stuck-at-1 faults;
   the inverted WAND fault model partially covers stuck-at-0 faults and covers stuck-at-1 faults;
   the stuck-at-0 fault model covers stuck-at-0 faults but does not cover stuck-at-1 faults;
   the inverted WOR fault model covers stuck-at-0 faults and partially covers stuck-at-1 faults; and
   the inverted fault model covers stuck-at-0 faults and stuck-at-1 faults.

6. The method of claim 1, wherein filtering the combined fault lists comprises determining (T0/S0), (T1/S1), wherein T0 is a first tester fail pattern count when defect activates the node to a logic low, S0 is a first simulation fail pattern when the stuck-at-0 fault is inserted in the node, T1 is a second tester fail pattern count when defect activates the node to a logic high, S1 is a second simulation fail pattern when the stuck-at-1 fault is inserted in the node.

7. A method for defect-based scan analysis comprising:
   identifying neighborhood net lists for each of a plurality of circuit nodes in a circuit;

injecting defects into the neighborhood net lists and modeling the defects with stuck-at-0 and stuck-at-1 fault models;

generating test patterns and applying the test patterns to the neighborhood net lists with the injected defects to obtain an observable output;

if the observable output has a stuck-at-0 fault model or a stuck-at-1 fault model, adding the test patterns to a set of effective test patterns;

sorting the effective test patterns into a first group of test patterns that yielded the output having the stuck-at-0 fault model and a second group of test patterns that yielded the output having the stuck-at-1 fault model;

performing stuck-at-0 fault simulations on the neighborhood net lists for each of the plurality of circuit nodes using the first group of test patterns to generate a first fault list;

performing stuck-at-1 fault simulations on the neighborhood net lists for each of the plurality of circuit node using the second group of test patterns to generate a second fault list;

deriving a complete set of fault models as a combination of the stuck-at-0 fault model and the stuck-at-1 fault model;

generating combined fault lists using the first and second fault lists and the complete set of fault models;

filtering the combined fault lists to yield a collection of effective faults; and mapping the defects to the collection of effective faults.

8. The method of claim 7, wherein the mapping of the defects comprises referring to a fault vs. defect lookup table.

9. The method of claim 7, wherein the filtering of the combined fault lists comprises removing faults with less effective coverage of the defects than the effective faults.

10. The method of claim 7, wherein the deriving of the complete set of fault models comprises deriving stuck-at-U, stuck-at-1, wired OR, wired AND, inverted WOR, inverted WAND, dominant, inverted, and escape fault models.

11. The method of claim 10, wherein the generating of the combined fault lists comprises considering faults that are completely covered, partially covered and not covered by the stuck-at-0 and stuck-at-1 fault models.

12. The method of claim , wherein the deriving of the complete set of fault models is carried out in a way so that:
the escape fault model does not cover stuck-at-0 faults and stuck-at-1 faults;
the stuck-at-1 fault model does not cover stuck-at-0 faults but covers stuck-at-I faults;
the wired AND fault model does not cover stuck-at-0 faults but partially covers stuck-at-1 faults;
the wired OR fault model partially covers stuck-at-0 faults but does not cover stuck-at-I faults;
the dominant fault model partially covers stuck-at-0 faults and partially covers stuck-at-1 faults;
the inverted WAND fault model partially covers stuck-at-0 faults and covers stuck-at-1 faults;
the stuck-at-0 fault model covers stuck-at-0 faults but does not cover stuck-at-1 faults;
the inverted WOR fault model covers stuck-at-0 faults and partially covers stuck-at-I faults; and
the inverted fault model covers stuck-at-0 faults and stuck-at-1 faults.

13. The method of claim 8, wherein the filtering of the combined fault lists comprises determining (T0/S0), (T1/S1), wherein T0 is a first tester fail pattern count when defect activates the node to a logic low, S0 is a first simulation fail pattern when the stuck-at-0 fault is inserted in the node, T1 is a second tester fail pattern count when defect activates the node to a logic high, S1 is a second simulation fail pattern when the stuck-at-1 fault is inserted in the node.

14. A method for defect-based scan analysis comprising:
for each node, performing stuck-at-0 fault simulation using stuck-at-0 fault test patterns and generating a first fault list;
for each node, performing stuck-at-1 fault simulation using stuck-at-1 fault test patterns and generating a second fault list;
combining the first and second fault lists into combined fault lists and deriving a description of the combined fault lists using a complete set of fault models;
filtering the combined fault lists to yield a collection of effective faults; and
determining a defect for each fault in the collection of effective faults.

15. The method of claim 14, wherein determining a defect comprises referring to a fault vs. defect lookup table.

16. The method of claim 14, wherein filtering the combined fault lists comprises removing faults with less effective coverage of the defect than the effective faults.

17. The method of claim 14, wherein deriving a description of the combined fault lists using a complete set of fault models comprises using stuck-at-0, stuck-at-1, wired OR, wired AND, inverted WOR, inverted WAND, dominant, inverted, and escape fault models.

18. The method of claim 14, wherein deriving a description of the combined fault lists using a complete set of fault models comprises considering faults that are completely covered, partially covered and not covered by the stuck-at-0 and stuck-at-1 fault models.

19. The method of claim 14, wherein filtering the combined fault lists comprises determining (T0/S0), (T1/S1), wherein T0 is a first tester fail pattern count when defect activates the node to a logic low, S0 is a first simulation fail pattern when the stuck-at-0 fault is inserted in the node, T1 is a second tester fail pattern count when defect activates the node to a logic high, S1 is a second simulation fail pattern when the stuck-at-1 fault is inserted in the node.

20. An apparatus comprising a computer-readable medium encoded with a computer program that, when executed, causes:
determining a neighborhood net for each node in a first circuit;
injecting defects into the neighborhood net and modeling the defects with stuck-at-0 and stuck-at-1 fault models;
generating test patterns and applying the test patterns to the neighborhood net with the injected defects;
determining whether the injected defects are observable as faults; and
adding the test patterns to a set of effective test patterns if the defects are observable as faults;
separating the test patterns in the set of effective test patterns into stuck-at-0 fault test patterns corresponding to stuck-at-0 fault models and stuck-at-1 fault test patterns corresponding to stuck-at-1 fault models;
performing stuck-at-0 fault simulation using the stuck-at-0 fault test patterns and in response generating a first fault list; and
performing stuck-at-1 fault simulation using the stuck-at-1 fault test patterns and in response generating a second fault list.

21. The apparatus of claim 20, wherein when executed, further causes:

combining the first and second fault lists into combined fault lists and deriving a description of the combined fault lists using a complete set of fault models;

filtering the combined fault lists to yield a collection of effective faults; and determining a defect for each fault in the collection of effective faults.

22. The apparatus of claim 21, wherein when executed, the determining of the defect is carried out in a manner that includes referring to a fault vs. defect lookup table.

23. The apparatus of claim 21, wherein when executed, the filtering of the combined fault lists is carried out in a manner that includes removing faults with less effective coverage of the defect than the effective faults.

24. The apparatus of claim 21, wherein when executed, the deriving of the description of the combined fault lists using a complete set of fault models is carried out in a manner that includes using stuck-at-0, stuck-at-1, wired OR, wired AND, inverted WOR, inverted WAND, dominant, inverted, and escape fault models.

25. The apparatus of claim 24, wherein when executed, the deriving of the description of the combined fault lists using a complete set of fault models is carried out in a manner that includes considering faults that are completely covered, partially covered and not covered by the stuck-at-0 and stuck-at-1 fault models.

26. The apparatus of claim 25, wherein when executed, the deriving of the description of the combined fault lists using a complete set of fault models is carried out in a manner that includes considering faults that are completely covered, partially covered and not covered by the stuck-at-0 and stuck-at-1 fault models, such that:

the escape fault model does not cover stuck-at-0 faults and stuck-at-1 faults;

the stuck-at-1 fault model does not cover stuck-at-0 faults but covers stuck-at-I faults;

the wired AND fault model does not cover stuck-at-0 faults but partially covers stuck-at-1 faults;

the wired OR fault model partially covers stuck-at-0 faults but does not cover stuck-at-I faults;

the dominant fault model partially covers stuck-at-0 faults and partially covers stuck-at-1 faults;

the inverted WAND fault model partially covers stuck-at-0 faults and covers stuck-at-1 faults;

the stuck-at-0 fault model covers stuck-at-0 faults but does not cover stuck-at-I faults;

the inverted WOR fault model covers stuck-at-0 faults and partially covers stuck-at-1 faults; and the inverted fault model covers stuck-at-0 faults and stuck-at-1 faults.

27. The apparatus of claim 20, wherein when executed, the filtering of the combined fault lists is carried out in a manner that includes determining (T0/S0), (T1/S1), wherein T0 is a first tester fail pattern count when defect activates the node to a logic low, S0 is a first simulation fail pattern when the stuck-at-0 fault is inserted in the node, T1 is a second tester fail pattern count when defect activates the node to a logic high, S1 is a second simulation fail pattern when the stuck-at-1 fault is inserted in the node.

28. A method for defect-based scan analysis, comprising:
identifying a neighborhood net for a circuit node;
injecting a defect into the neighborhood net;
modeling the defect with a fault including a stuck-at-0 fault and a stuck-at-1 fault;
generating a test pattern;
inputting the test pattern to the neighborhood net and generating an observable output;
if the observable output includes the fault, adding the test pattern to a set of effective test patterns;
sorting the effective test patterns into a first group of test patterns that are associated with the stuck-at-0 fault and a second group of test patterns that are associated with the stuck-at-1 fault;
generating fault lists by performing simulations on the circuit node, the simulations including one of stuck-at-0 fault simulations that are performed using the first group of test patterns and stuck-at-1 fault simulations that are performed using the second group of test patterns;
deriving a complete set of fault models as a combination of the stuck-at-0 fault and the stuck-at-1 fault;
deriving a description of the fault lists using the complete set of fault models;
filtering the fault lists to yield effective faults; and
mapping the defect to one of the effective faults.

29. The method of claim 28, further including:
before the sorting of the effective test patterns, if the observable output is free of the fault, generating a further test pattern and inputting the further test pattern to the neighborhood net; and
if a fault coverage is determined to be insufficient, generating an additional test pattern and inputting the additional test pattern to the neighborhood net.

30. The method of claim 28, wherein:
the deriving of the complete set of fault models includes deriving stuck-at-0, stuck-at-1, wired OR, wired AND, inverted WOR, inverted WAND, dominant, inverted, and escape fault models;
the deriving of the description of the fault lists includes considering faults that are completely covered, partially covered and not covered by the stuck-at-0 and stuck-at-1 fault models;
the filtering of the fault lists includes removing faults with less effective coverage of the defect than the effective faults; and
the mapping of the defect includes referring to a fault vs. defect lookup table.

* * * * *

UNITED STATES PATENT AND TRADEMARK OFFICE
CERTIFICATE OF CORRECTION

| | | |
|---|---|---|
| PATENT NO. | : 7,971,119 B2 | Page 1 of 1 |
| APPLICATION NO. | : 11/537043 | |
| DATED | : September 26, 2006 | |
| INVENTOR(S) | : Will Hsu | |

It is certified that error appears in the above-identified patent and that said Letters Patent is hereby corrected as shown below:

ON THE TITLE PAGE:

Item (73) Assignee: change "aiwan" to "Taiwan"

Signed and Sealed this
Thirtieth Day of August, 2011

David J. Kappos
*Director of the United States Patent and Trademark Office*